United States Patent
Chen et al.

(10) Patent No.: US 7,859,013 B2
(45) Date of Patent: Dec. 28, 2010

(54) METAL OXIDE FIELD EFFECT TRANSISTOR WITH A SHARP HALO

(75) Inventors: Huajie Chen, Danbury, CT (US); Judson R. Holt, Wappingers Falls, NY (US); Rangarajan Jagannathan, Hopewell Junction, NY (US); Wesley C. Natzle, New Paltz, NY (US); Michael R. Sievers, Poughkeepsie, NY (US); Richard S. Wise, Newbergh, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 11/955,591

(22) Filed: Dec. 13, 2007

(65) Prior Publication Data

US 2008/0093629 A1    Apr. 24, 2008

Related U.S. Application Data

(62) Division of application No. 11/420,318, filed on May 25, 2006, now Pat. No. 7,384,835.

(51) Int. Cl.
    *H01L 21/02*    (2006.01)
(52) U.S. Cl. .................. 257/190; 257/192; 257/347; 257/E29.193
(58) Field of Classification Search ............. 257/192, 257/347, E29.193, 190
    See application file for complete search history.

(56) References Cited

U.S. PATENT DOCUMENTS

| | | | |
|---|---|---|---|
| 5,182,619 A | 1/1993 | Pfiester | |
| 6,248,637 B1 * | 6/2001 | Yu | 438/300 |
| 6,555,437 B1 * | 4/2003 | Yu | 438/300 |
| 6,656,824 B1 | 12/2003 | Hanafi et al. | |
| 6,730,552 B1 | 5/2004 | Abadeer et al. | |
| 6,774,000 B2 | 8/2004 | Natzle et al. | |
| 6,858,532 B2 | 2/2005 | Natzle et al. | |
| 6,888,221 B1 | 5/2005 | Joseph et al. | |
| 6,949,796 B1 | 9/2005 | Ellis-Monaghan et al. | |
| 6,958,286 B2 | 10/2005 | Chen et al. | |
| 2004/0191998 A1 | 9/2004 | Natzle et al. | |
| 2004/0248368 A1 | 12/2004 | Natzle et al. | |
| 2005/0035408 A1 | 2/2005 | Wang et al. | |

(Continued)

*Primary Examiner*—Jerome Jackson, Jr.
*Assistant Examiner*—Dale Page
(74) *Attorney, Agent, or Firm*—Gibb I.P. Law Firm, LLC; Ian D. MacKinnon, Esq.

(57) ABSTRACT

Disclosed are embodiments of a MOSFET with defined halos that are bound to defined source/drain extensions and a method of forming the MOSFET. A semiconductor layer is etched to form recesses that undercut a gate dielectric layer. A low energy implant forms halos. Then, a COR pre-clean is performed and the recesses are filled by epitaxial deposition. The epi can be in-situ doped or subsequently implanted to form source/drain extensions. Alternatively, the etch is immediately followed by the COR pre-clean, which is followed by epitaxial deposition to fill the recesses. During the epitaxial deposition process, the deposited material is doped to form in-situ doped halos and, then, the dopant is switched to form in-situ doped source/drain extensions adjacent to the halos. Alternatively, after the in-situ doped halos are formed the deposition process is performed without dopants and an implant is used to form source/drain extensions.

17 Claims, 10 Drawing Sheets

U.S. PATENT DOCUMENTS

2005/0093084 A1 5/2005 Wang et al.
2005/0218114 A1 10/2005 Yue et al.
2006/0237746 A1* 10/2006 Orlowski et al. ............ 257/192
2008/0121985 A1* 5/2008 Chen et al. .................. 257/327

* cited by examiner

METAL OXIDE FIELD EFFECT TRANSISTOR WITH A SHARP HALO

CROSS-REFERENCE TO RELATED APPLICATIONS

This application is a divisional of U.S. application Ser. No. 11/420,318 filed May 25, 2006, the complete disclosure of which, in its entirety, is herein incorporated by reference.

BACKGROUND

1. Field of the Invention

The embodiments of the invention generally relate to a metal oxide semiconductor field effect transistor (MOSFET) and to a method of forming the transistor with a sharp halo.

2. Description of the Related Art

Oftentimes halos are incorporated into metal oxide semiconductor field effect transistors (MOSFET) devices in order to reduce the short channel effects that have resulted from the scaling of such devices. Specifically, these halos have the same conductivity type as the transistor body and are generally positioned around the edges of the source/drain extensions below the gate. Such halos reduce the depletion region between the source/drain regions and the channel region and, thereby, reduce punch through (i.e., reduce lateral diffusion of dopants from the source/drain regions into the channel region). The strength of the halo effect depends on both the doping concentration of the halo and on confinement of the halo dopants (e.g., by limiting diffusion of the halo dopants towards the channel region and the substrate). Thus, by forming sharply defined halos that remain closely bound to the source/drain extensions, optimal punch through reduction can be achieved.

Traditionally, halos are formed by using a relatively high energy implantation process in order to penetrate the halo dopant (e.g., implantation of a first conductivity type dopant) to the correct depth. The halo implantation process is then followed by another implant (e.g., implantation of a second conductivity type dopant) which forms the source/drain extensions. However, the high energy process that is used to implant the halo dopants to the correct depth also results in a significant amount of diffusion of that halo dopant towards the wafer substrate and towards channel region. Because the halo dopant is not confined, the punch through reduction function of the halo is minimized. Therefore, there is a need in the art for an improved MOSFET device with sharply defined halos that have a high dopant concentration and that are bound to sharply defined source/drain extensions.

SUMMARY

In view of the foregoing, disclosed herein are several embodiments of a metal oxide semiconductor field effect transistor (MOSFET) and an associated method of fabricating the MOSFET. The MOSFET comprises sharply defined halos that have a predetermined dopant concentration and that are bound to sharply defined source/drain extensions in order to minimize punch through.

More particularly, disclosed are embodiments of a MOSFET structure comprising a substrate, a semiconductor layer on the substrate and a gate on the semiconductor layer. Specifically, the semiconductor layer has a first surface (i.e., a lower surface) that is adjacent to the substrate and a second surface (i.e., an upper surface) that is adjacent to the gate. The semiconductor layer comprises a channel region at the upper surface immediately below the gate and source/drain extensions also at the upper surface adjacent to the channel region (i.e., the channel region is disposed between the source/drain extensions). The semiconductor layer further comprises halos that are located a predetermined distance below the upper surface of the semiconductor layer and that border the source/drain extensions such that they are disposed between the source/drain extensions and the channel region and such that they are also disposed between the source/drain extensions and the lower surface of the semiconductor layer. In each embodiment of the invention, the halos comprise a predetermined concentration of a first conductivity type dopant and are sharply defined such that the first conductivity type dopant does not extend (i.e., diffuse) into the channel region or to the lower surface of the semiconductor layer and to the substrate, as seen with the prior art.

In one embodiment of the invention, the halos comprise implant regions and the source/drain extensions comprise second conductivity type epitaxial layers above the implant regions. These second conductivity type epitaxial layers can be either in-situ doped or implanted with the second conductivity type dopant. Additionally, these epitaxial layers can comprise any suitable semiconductor material (e.g., silicon or silicon germanium). Thus, the source/drain extensions can comprise either the same or different semiconductor materials as other features of the transistor (e.g., the substrate, the halos, the channel region, etc.).

In another embodiment of the invention, the halos comprise first epitaxial layers that are in-situ doped with the first conductivity type dopant. In this embodiment, the source/drain extensions comprise additional epitaxial layers that are deposited above the first epitaxial layers. The additional epitaxial layers (i.e., second epitaxial layers) have a second conductivity type and can be either in-situ doped or implanted with the second conductivity type dopant. Both the first and second epitaxial layers can comprise any suitable semiconductor material (e.g., either silicon or silicon germanium). Thus, the halos and source/drain extensions can comprise the same or different semiconductor materials. Additionally, the halos and/or the source/drain extensions can comprise the same or different semiconductor materials as other features of the transistor (e.g., the substrate, the channel region, etc.).

Also disclosed are embodiments of methods of forming the above-described MOSFETs. Specifically, each of the embodiments of the method comprises using conventional processing methods to form a gate on a semiconductor layer above a substrate. Specifically, a semiconductor layer with a first conductivity type is formed with a lower surface (i.e., first surface) adjacent to the substrate. A gate dielectric layer is formed (e.g., by depositing a dielectric material, such as a high k dielectric material) on the upper surface (i.e., second surface) of the semiconductor layer and a gate conductor is formed (e.g., deposited and lithographically patterned) above the gate dielectric layer.

After the gate is formed, narrow sidewall spacers are formed above the gate dielectric layer adjacent to the opposing sidewalls of the gate conductor. Specifically, these sidewalls spacers can be formed so that they are narrower than the gate conductor. The sidewall spacers can be single or multi-layered sidewalls spacers and can be formed from a variety of dielectric materials including oxides, nitrides and/or high k dielectrics (i.e., dielectric materials having a dielectric constant that is greater than approximately 4.0). Additionally, these sidewall spacers may be formed as either permanent sidewall spacers, as sacrificial sidewall spacers (i.e., disposable sidewall spacers), or with both permanent and sacrificial layers.

After the sidewall spacers are formed, the semiconductor layer is etched to form recesses that extend beneath the gate dielectric layer on both sides of the gate conductor. The recesses are specifically formed so that they extend beneath the sidewall spacers a first predetermined distance towards the gate conductor and extend below the upper surface towards the lower surface of the semiconductor layer a second predetermined distance. This etching process can be conducted in multiple stages, for example, by performing both a directional etch process and an isotropic etch process. This etching process exposes a third surface of the semiconductor layer within each of the recesses below sidewall spacers.

Each of the embodiments of the method further comprises steps that may be used to form within each of these recesses both a sharply defined halo and a sharply defined source/drain extension.

In one embodiment of the method, after the recesses are etched, a first conductivity type dopant is implanted to a predetermined depth below the surfaces of the recesses (i.e., the third surfaces) in order to form the halos. Etching the recesses before the halos are implanted reduces the depth required for the implant and, thus, allows this implantation process to be accomplished using a low energy implantation process (as opposed to a high energy implantation process). The low energy implantation process avoids diffusion of the first conductivity type dopant into the channel region below the gate and also avoids diffusion of the first conductivity type dopant to the lower surface of the semiconductor layer and, specifically, to the substrate. Additionally, a post-implant anneal may be performed using a laser anneal process, as opposed to a conventional thermal anneal process, in order to activate the implanted dopants and repair implantation damage while still avoiding the diffusion described above.

Once the halo implant is performed, the doped semiconductor surfaces (i.e., the third surfaces of the semiconductor layer exposed within the recesses) are cleaned. Specifically, a chemical oxide removal (COR) process, as opposed to a conventional aqueous HF solution, is used to clean the surfaces within the recesses.

Following this COR cleaning process, a selective epitaxial semiconductor deposition process is performed to deposit a suitable semiconductor material (e.g., silicon, silicon germanium, etc.) onto the exposed recess surfaces, thereby, filling the recesses. During this deposition process, second conductivity type dopants can be incorporated into the semiconductor material so as to form in-situ doped source/drain extensions on the recess surfaces adjacent to the implanted halo regions. Alternatively, the epitaxial deposition process can be performed in the absence of dopants. Then, the source/drain extensions can be formed by implanting the second conductivity type dopant into the deposited semiconductor material following the selective epitaxial deposition process.

In another embodiment of the method, after the recesses are etched, a chemical oxide removal (COR) process, as opposed to a conventional aqueous HF solution, is used to clean the recess surfaces.

Following the COR cleaning process, a selective epitaxial semiconductor deposition process is performed to deposit a semiconductor material (e.g., silicon, silicon germanium, etc.) onto the exposed recess surfaces, thereby, filling the recesses. During this deposition process, first conductivity type dopants can be incorporated into the semiconductor material so as to form in-situ doped halos. Once the in-situ doped halos are formed, the dopant that is incorporated into the semiconductor material can be switched from a first conductivity type dopant to a second conductivity type dopant so as to form in-situ doped source/drain extensions adjacent to the halo regions. Alternatively, once the in-situ doped halos are formed, the epitaxial deposition process can continue in the absence of dopants until the recess is filled. Then, the source/drain extensions can be formed by implanting the second conductivity type dopant into the deposited semiconductor material above the halos.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 1:
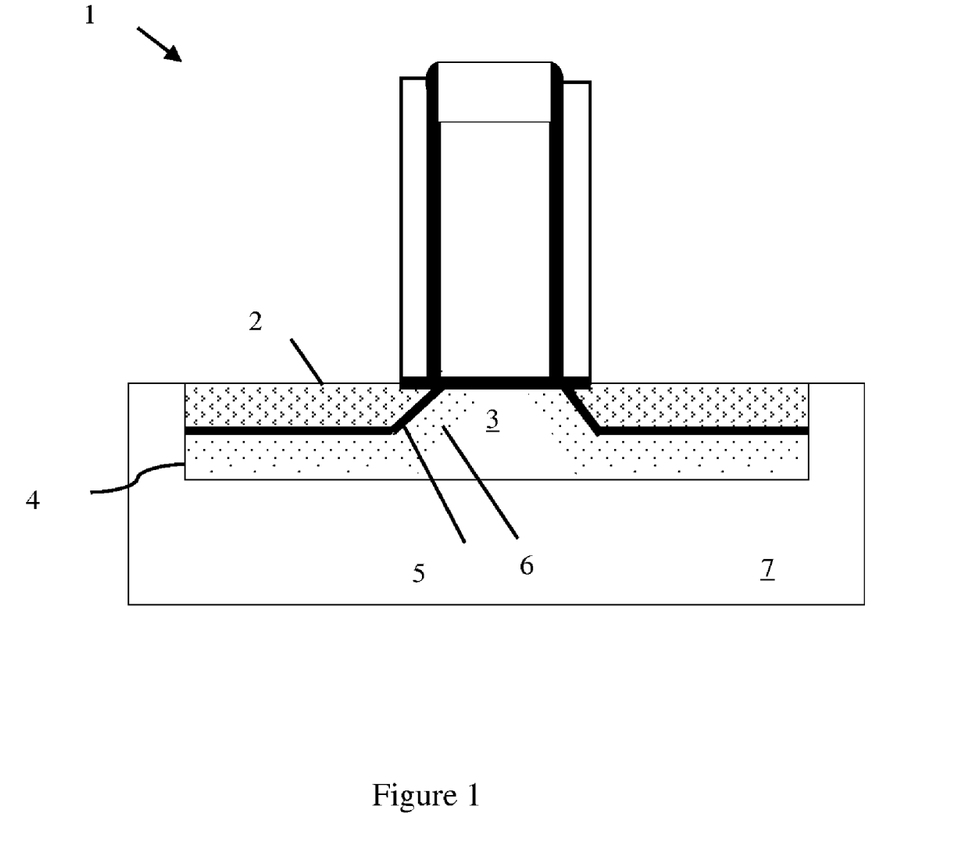
FIG. 1 is a schematic diagram illustrating a MOSFET device.

Referring to the metal oxide semiconductor field effect transistor (MOSFET) structure 1 of FIG. 1, halos 5 are typically formed using a relatively high energy implantation process in order to penetrate a first conductivity type dopant (i.e., a dopant that has the same conductivity type as the channel region 3 of the MOSFET 1) to a predetermined depth in the semiconductor layer 4 and to achieve a predetermined dopant concentration. This halo 5 implantation process is then typically followed by another implant process to form source/drain extensions 2 with a second conductivity type, above the halos 5. However, the high energy process that is used to implant the halos 5 to the predetermined depth and achieve the predetermined dopant concentration also results in diffusion 6 of the halo dopant such that the halo 5 extends down to the substrate 7 and into the channel region. This diffusion reduces confinement of the halos 5 and, thereby, minimizes the function of the halos (i.e., minimizes punch through reduction). Therefore, there is a need in the art for an improved MOSFET device with sharply defined halos bound to sharply defined source/drain extensions in order to optimize the punch through reduction function of the halos.

In view of the foregoing, disclosed are embodiments of a metal oxide semiconductor field effect transistor (MOSFET) structure with sharply defined halos that are positioned at a predetermined location in the semiconductor layer, that have a predetermined high dopant concentration and that are bound to sharply defined source/drain extensions in order minimize punch through. Also, disclosed are embodiments of a method of forming such MOSFET structures. For illustration purposes only, the MOSFETs described herein are p-FETs having p-type source/drain regions and n-type channel regions. However, those skilled in the art will recognized that the method of the invention may also be used to form n-FETs having n-type source/drain regions and a p-type channel regions.

More particularly, referring to FIGS. 2, 3, 4 and 5 disclosed are embodiments of a MOSFET structure 200, 300, 400, and 500, respectively. Each of the embodiments of the MOSFET 200, 300, 400, and 500 comprises a substrate 90, a semiconductor layer 40 on the substrate 90 and a gate 50 on the semiconductor layer 40. Specifically, the semiconductor layer 40 has a first surface 42 (i.e., a lower surface) that is adjacent to the substrate 90 and a second surface 41 (i.e., an upper surface) that is adjacent to the gate 50. The semiconductor layer 40 comprises a channel region 30 at the upper surface 41 immediately below the gate 50 and source/drain extensions (see 220 of FIG. 2, 320 of FIG. 3, 420 of FIG. 4 and 520 of FIG. 5) also at the upper surface 42 adjacent to the channel region 30 (i.e., the channel region 30 is disposed between the source/drain extensions). The semiconductor layer 40 further comprises halos (see 210 of FIG. 2, 310 of FIG. 3, 410 of FIG. 4 and 510 of FIG. 5) that are located a predetermined distance 43 below the upper surface 42 of the semiconductor layer 40 and that border the source/drain extensions (see 220 of FIG. 2, 320 of FIG. 3, 420 of FIG. 4 and 520 of FIG. 5) such that they are disposed between the source/drain extensions and the channel region and such that they are also disposed between the source/drain extensions and the lower surface 41 of the semiconductor layer 40. In each embodiment of the invention, the halos (see 220 of FIG. 2, 320 of FIG. 3, 420 of FIG. 4 and 520 of FIG. 5) comprise a predetermined concentration of a first conductivity type dopant and are sharply defined such that the first conductivity type dopant does not extend (i.e., diffuse) into the channel region 30 or to the lower surface 41 of the semiconductor layer 40 and the substrate 90, as seen with the prior art.

Figure 2:
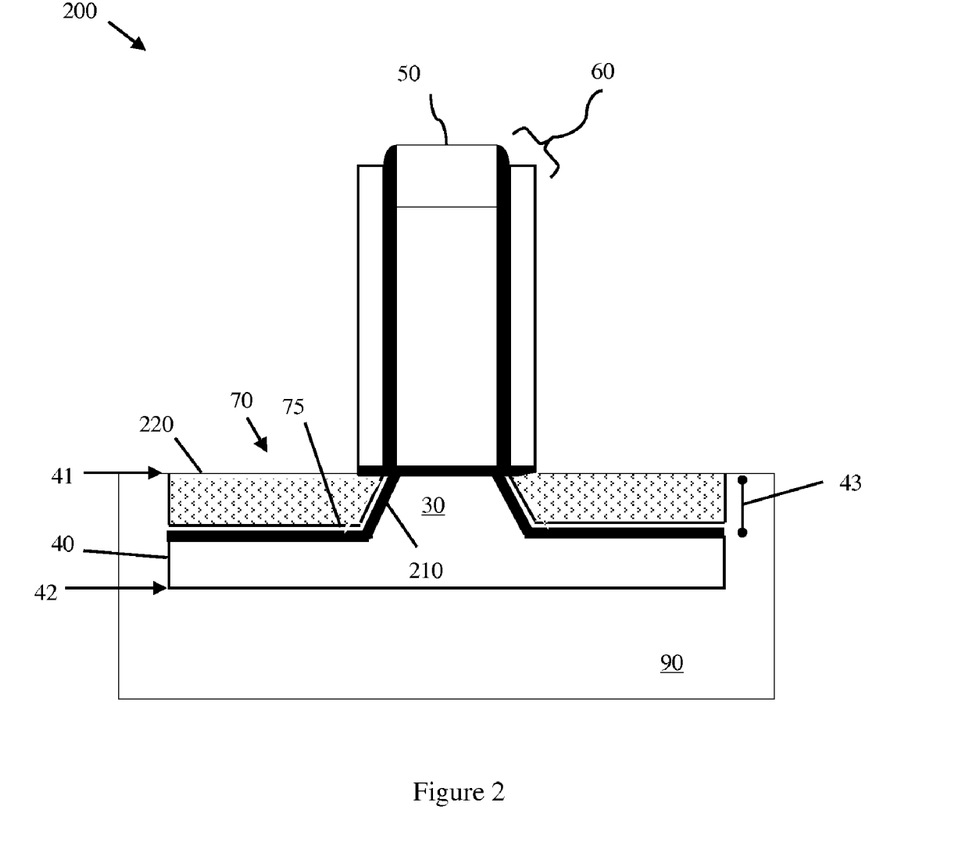
FIG. 2 is a schematic diagram illustrating an embodiment of the MOSFET device of the invention.
Figure 3:
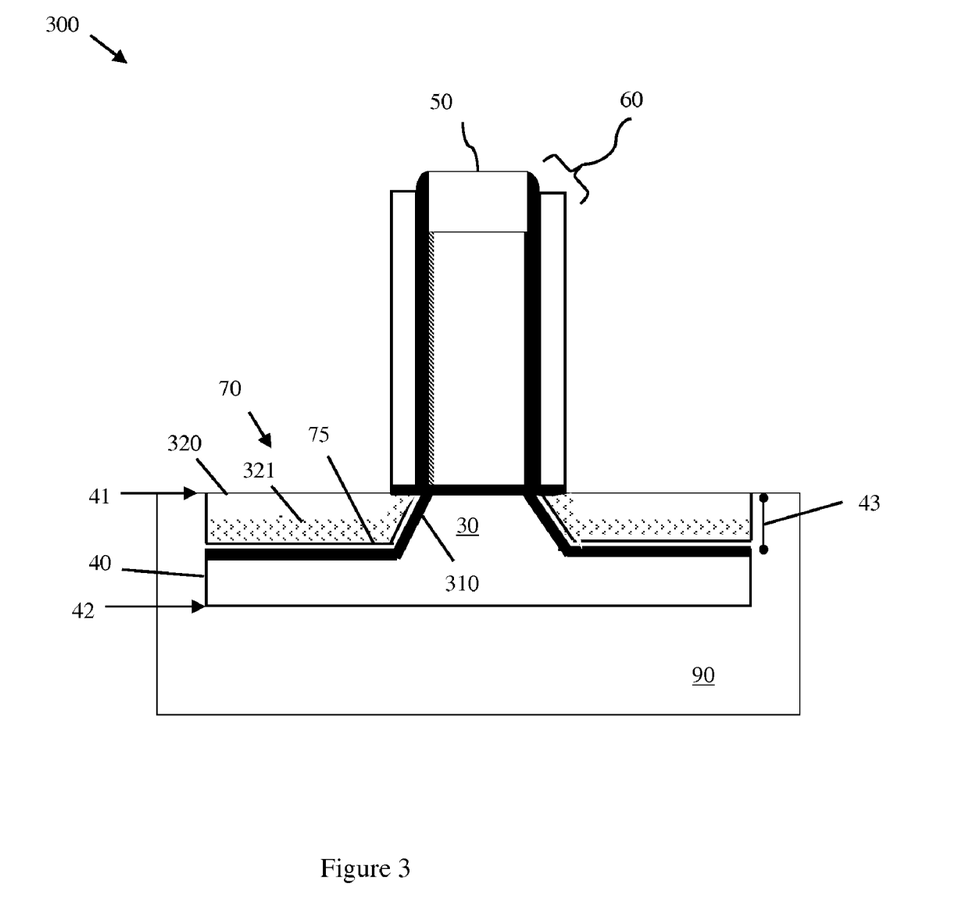
FIG. 3 is a schematic diagram illustrating another embodiment of the MOSFET device of the invention.

Specifically, referring to FIGS. 2 and 3 in one embodiment of the invention, the halos 210, 310 comprise implant regions (e.g., with an implanted dopant concentration of up to approximately $1 \times 10^{21}$ atoms/cm$^3$). In this embodiment, the source/drain extensions 220, 320 comprise second conductivity type epitaxial layers above the implant regions 210, 310. These second conductivity type epitaxial layers can be either in-situ doped (see source/drain extensions 220 of FIG. 2) or implanted with the second conductivity type dopant (see implanted regions 321 in source/drain extensions 320 of FIG. 3). Additionally, these epitaxial layers can comprise any suitable semiconductor material (e.g., silicon or silicon germanium). Thus, the source/drain extensions 220, 320 can comprise either the same or different semiconductor materials as other features of the transistor 200, 300 (e.g., the substrate 90, the halos (see 210 of FIG. 2 or 310 of FIG. 3) the channel region 30, etc.).

Figure 4:
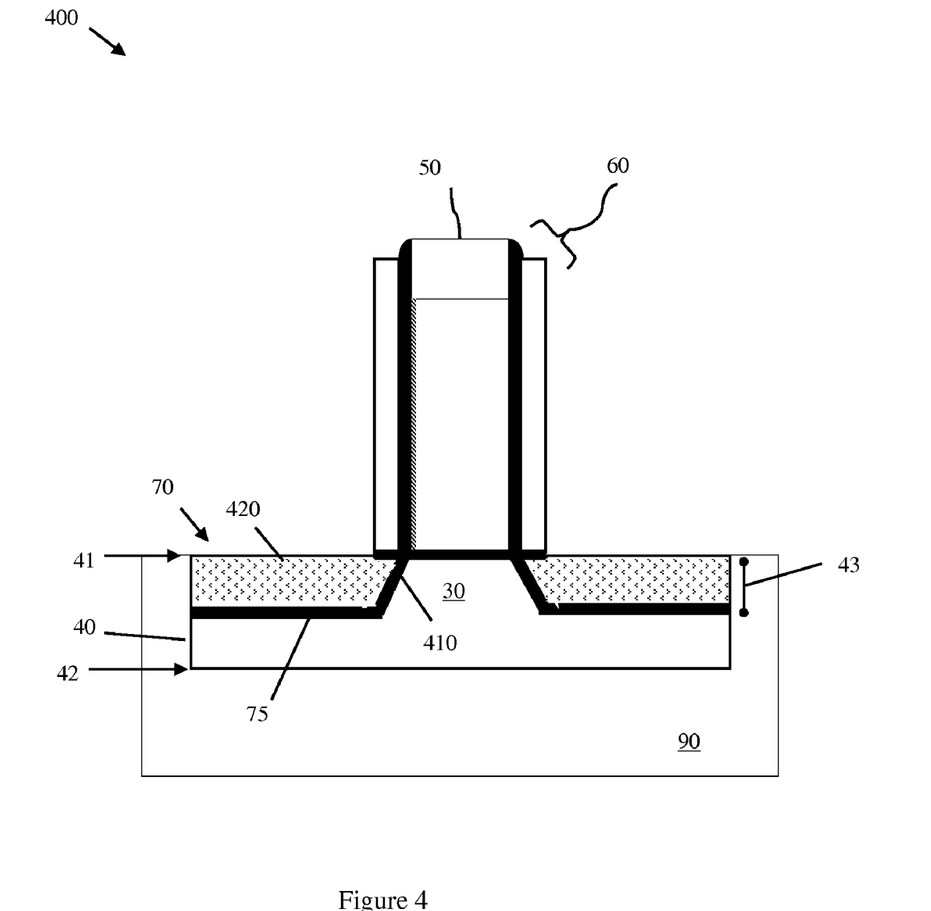
FIG. 4 is a schematic diagram illustrating another embodiment of the MOSFET device of the invention.
Figure 5:
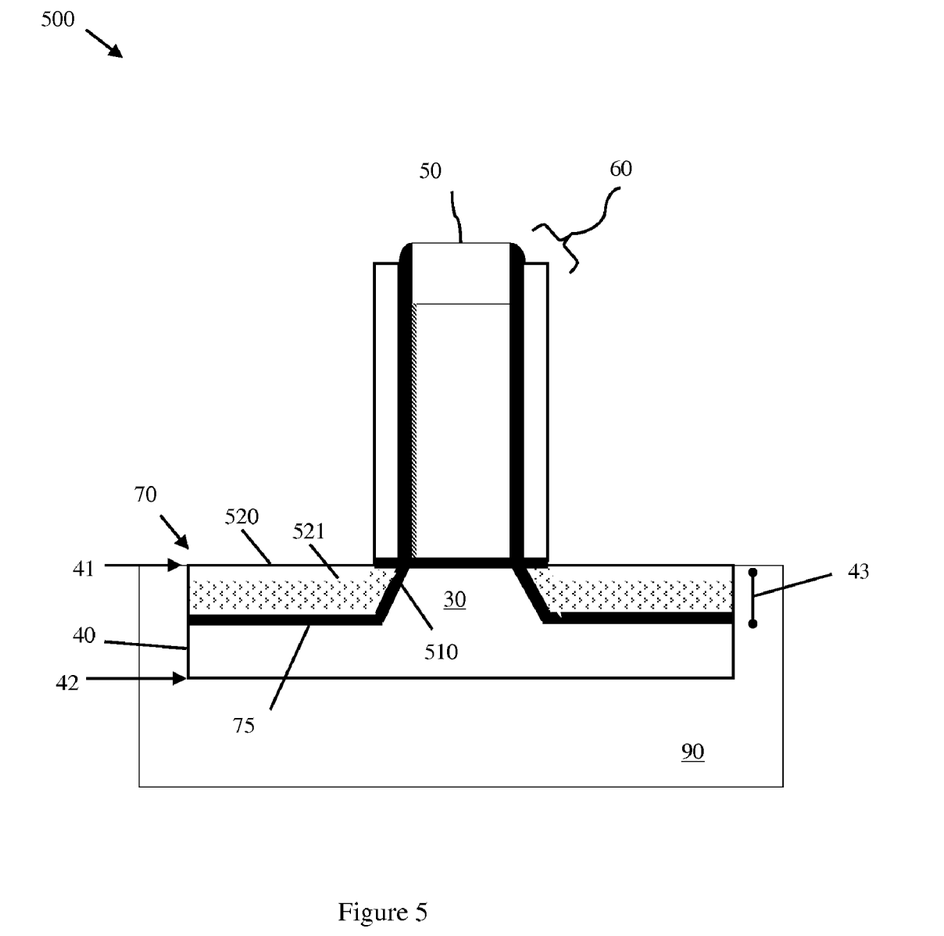
FIG. 5 is a schematic diagram illustrating another embodiment of the MOSFET device of the invention.

Referring to FIGS. 4 and 5, in another embodiment of the invention, the halos 410, 510 comprise first epitaxial layers that are in-situ doped with the first conductivity type dopant (e.g., with a dopant concentration of up to approximately $5 \times 10^{20}$ atoms/cm$^3$). In this embodiment, the source/drain extensions 420, 520 comprise additional epitaxial layers that are deposited above the first epitaxial layers. The additional epitaxial layers (i.e., second epitaxial layers) have a second conductivity type and can be either in-situ doped (see source/drain extensions 420 of FIG. 4) or implanted with the second conductivity type dopant (see implanted regions 521 of source/drain extensions 520 of FIG. 5). Both the first and second epitaxial layers can comprise any suitable semiconductor material (e.g., either silicon or silicon germanium). Thus, the halos 410, 510 and source/drain extensions 420, 520 can comprise the same or different semiconductor materials. Additionally, the halos 410, 510 and/or the source/drain extensions 420, 520 can comprise the same or different semiconductor materials as other features of the transistor 400, 500 (e.g., the substrate 90, the channel region 30, etc.).

Figure 6:
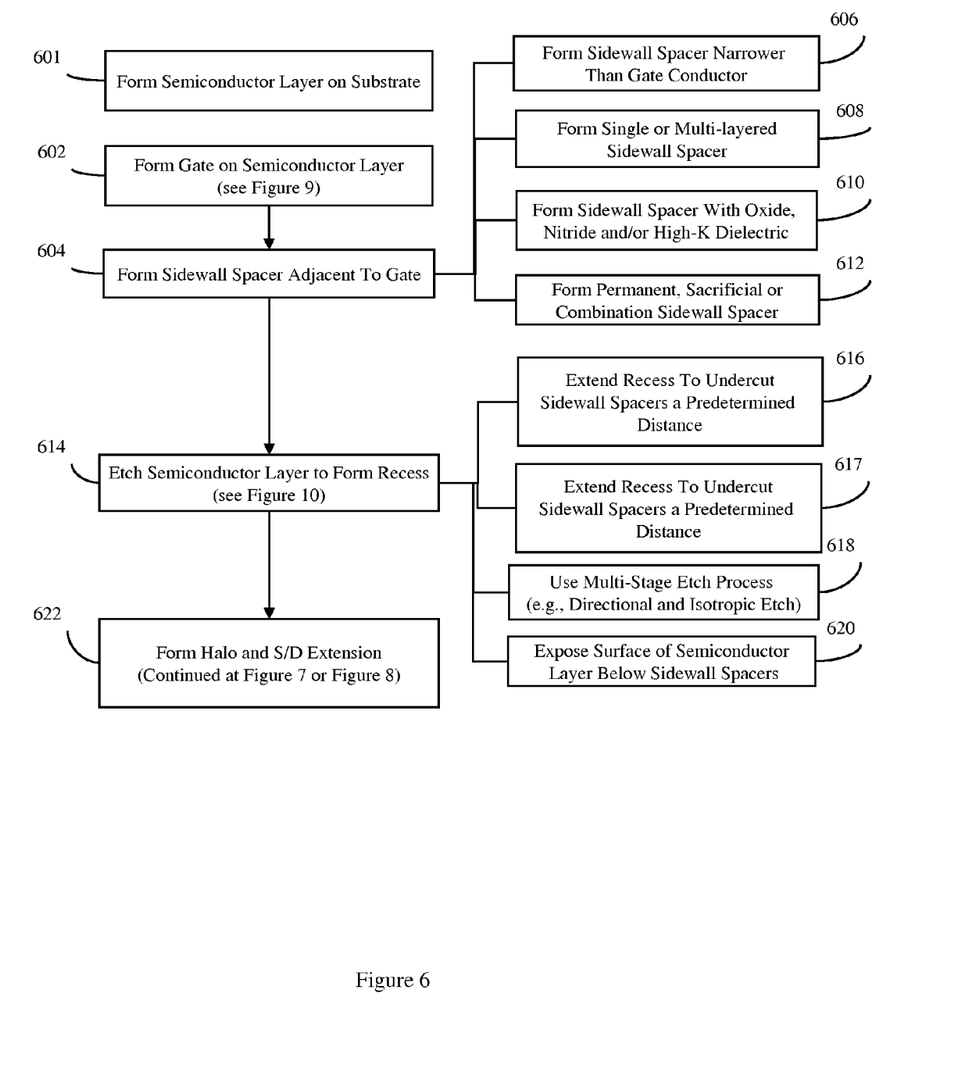
FIGS. 6-8 are flow diagrams illustrating the embodiments of the method of the invention.
Figure 9:
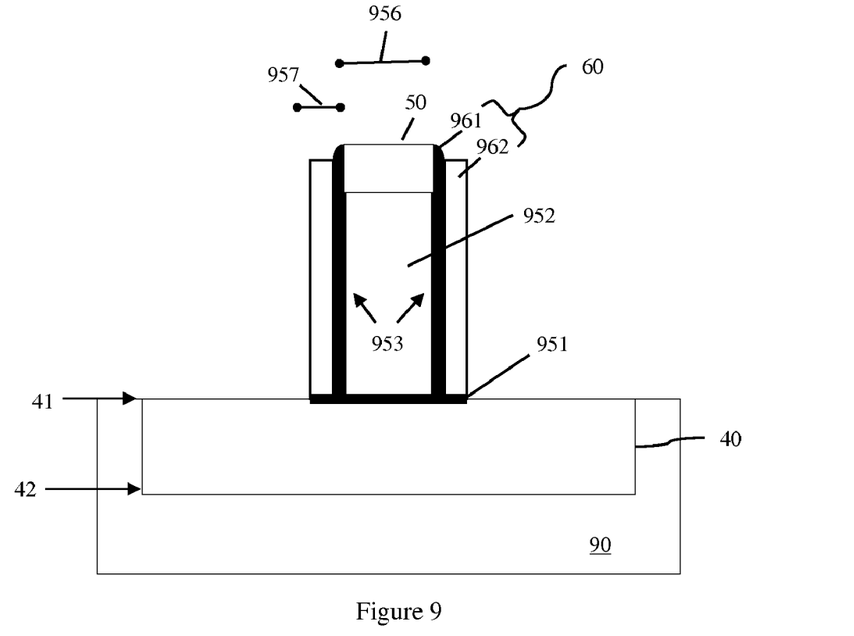
FIG. 9 is schematic diagram illustrating a partially completed MOSFET device following process 602 of FIG. 6.

Also disclosed are embodiments of methods of forming the above-described MOSFETs 200, 300, 400, and 500 of FIGS. 2-5, respectively. Specifically, referring to FIG. 6, each of the embodiments of the method comprises using conventional processing methods to form a gate 50 on a semiconductor layer 40 above a substrate 90 (601-602, see FIG. 9). That is, a semiconductor layer 40 with a first conductivity type is formed with a lower surface 41 (i.e., first surface) adjacent to the substrate 90. For example, an n-type semiconductor layer 40 can be formed on a p-substrate 90. A gate dielectric layer 951 is formed (e.g., by depositing a dielectric material) above the semiconductor layer 40. A high k dielectric material (i.e., dielectric material having a dielectric constant that is greater than 4.0) is optimal so that etching process (see process 614) and cleaning processes (see process 704 of FIG. 7 or process 802 of FIG. 8), described below, can be accomplished without shorting the gate 50. Once the gate dielectric layer 951 is formed, a gate conductor 952 is formed (e.g., deposited and lithographically patterned) above the gate dielectric layer 951.

After the gate 50 is formed at process 602, narrow sidewall spacers 60 are formed above the gate dielectric layer 951 adjacent to the opposing sidewalls 953 of the gate conductor 952 (604). Specifically, these sidewalls spacers 60 can be formed with a predetermined width 957 that is less than the width 956 of the gate conductor 952 (i.e., the sidewall spacers 60 are narrower than the gate conductor 952) (606). This predetermined width 956 is selected so that during subsequent etching (at process 614, described below) recesses that under cut the sidewall spacers 60 a predetermined distance (71 of FIG. 10) towards the gate conductor 952 can be etched into the semiconductor layer 40 minimizing the etch depth (73 of FIG. 10). These sidewall spacers 60 can be single or multi-layered sidewalls spacers (e.g., layers 961 and 962) (608) and can be formed from a variety of dielectric materials including oxides, nitrides and/or high k dielectrics (i.e., dielectric materials having a dielectric constant that is greater than approximately 4.0) (610). Additionally, these sidewall spacers 60 may be formed as permanent sidewall spacers, may be formed as sacrificial sidewall spacers (i.e., disposable sidewall spacers that will be removed during subsequent processing and replaced with permanent sidewall spacers during subsequent processing) or with both sacrificial and permanent layers (612). For example, permanent sidewall spacers 60 can be formed using high k dielectrics that can withstand subsequent chemical oxide removal (COR) cleaning (at processes 704 of FIG. 7 or process 802 of FIG. 8, described below). The different types of sidewall spacers may be formed using conventional processing techniques.

Figure 10:
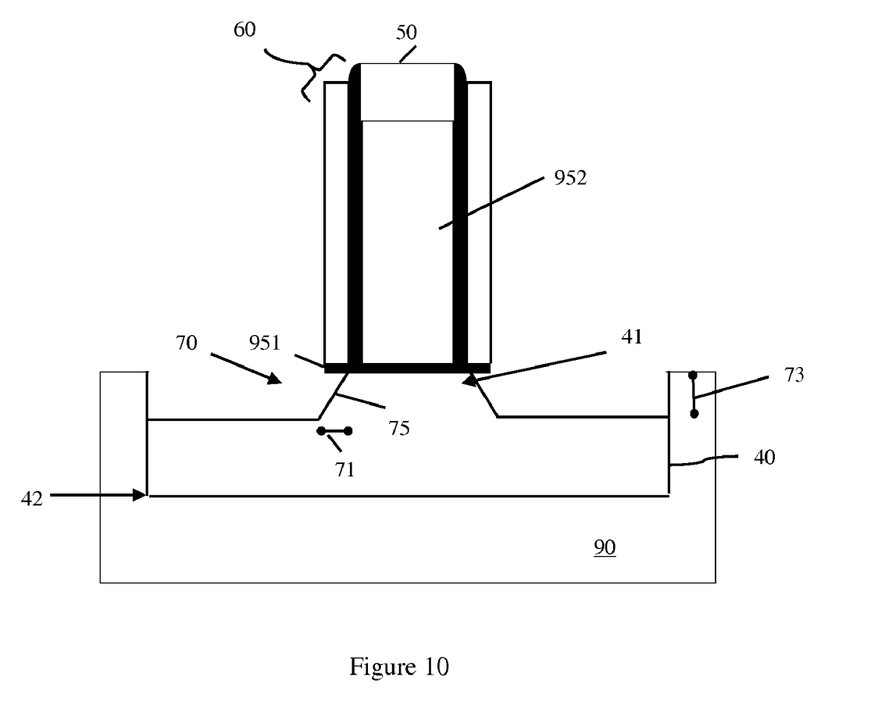
FIG. 10 is schematic diagram illustrating a partially completed MOSFET device following process 614 of FIG. 6.

After the sidewall spacers 60 are formed adjacent to the gate 50 at process 604, the semiconductor layer 40 is etched to form recesses 70 below the gate dielectric layer 951 on both sides of the gate conductor 952 (614, see FIG. 10). The recesses 70 are specifically formed so that they extend beneath the sidewall spacers 60 a first predetermined distance 71 towards the gate conductor 952 (616) and so that they extend below the upper surface 42 of the semiconductor layer 40 a second predetermined distance 73 (617). This etching process 614 can be conducted in multiple stages, for example, by performing both a directional etch (e.g., to etch from the upper surface 42 towards the lower surface 41) and an isotropic etch process (e.g., to form the undercut below the sidewall spacers 60). This etching process 614 exposes a surface 75 (i.e., a third surface) of the semiconductor layer 40 within each of the recesses 70.

Each of the embodiments of the method further comprises steps that may be used to form within each of these recesses 70 both sharply defined halos and sharply defined source/drain extensions (622).

Figure 7:
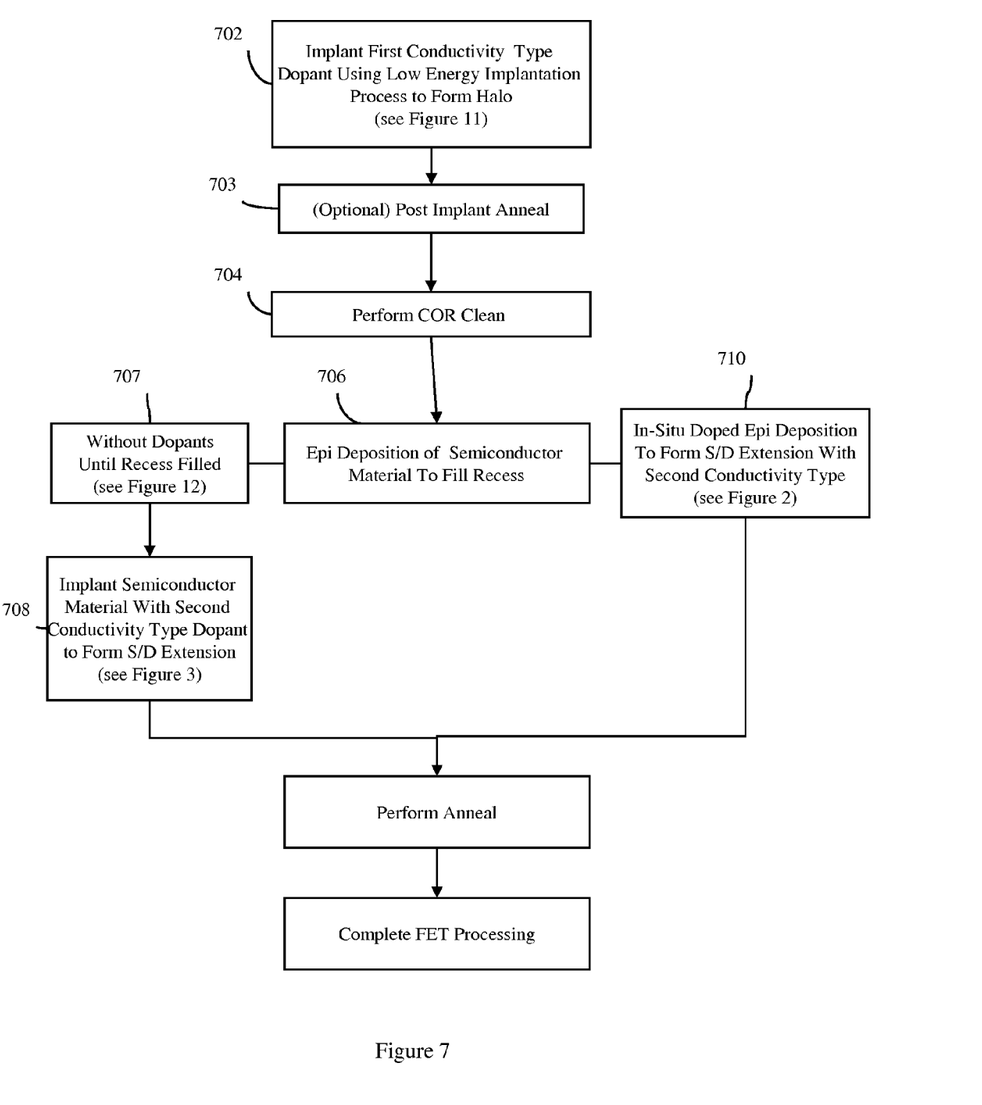
Figure 11:
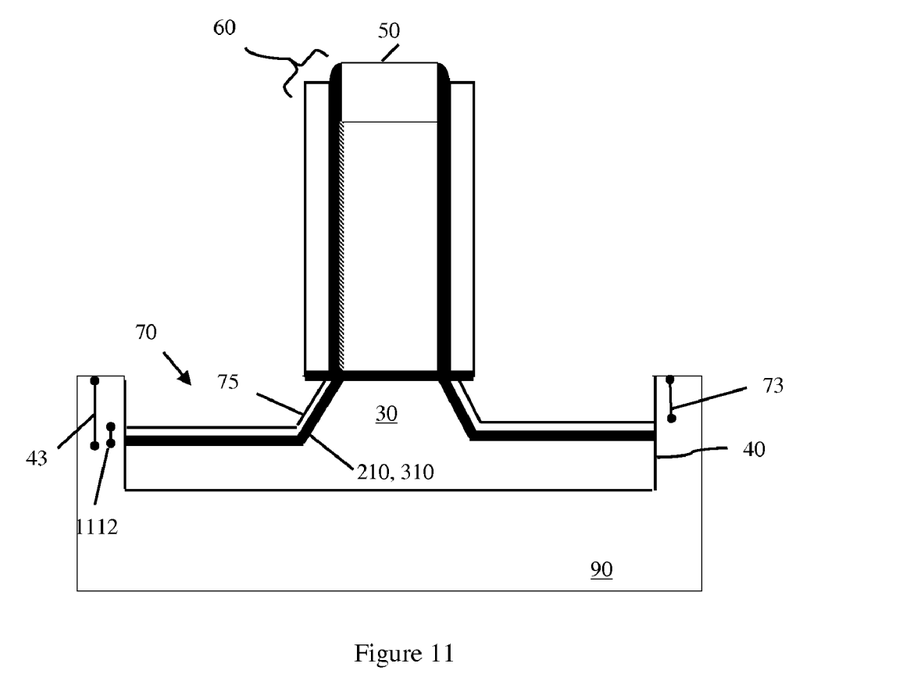
FIG. 11 is schematic diagram illustrating a partially completed MOSFET device following process 702 of FIG. 7.

Specifically, referring to FIG. 7, in one embodiment of the method, after the recesses 70 are etched (at process 614), a predetermined concentration (e.g., up to approximately $1\times10^{21}$ atoms/cm$^3$) of a first conductivity type dopant (e.g., an n-type dopant, such as phosphorous (P), arsenic (As) or Antimony (Sb)) is implanted to a predetermined depth 1112 below the surfaces 75 of the recesses 70 so as to form the halos 210 of FIG. 2 or 310 of FIG. 3 (702, see FIG. 11). Etching the recesses 70 before the halos 210, 310 are implanted at process 70 necessarily reduces the required implant depth 1112 for deep halos (e.g., for halos at the second predetermined depth 43). Thus, the preceding etch 614 allows this implantation process 702 to be accomplished using a low energy implantation process (e.g., less than approximately 3 keV and, preferably, less than approximately 1 keV (including plasma immersion doping)), as opposed to a high energy implantation process, in order to achieve the predetermined dopant concentration. The low energy implantation process avoids diffusion of the first conductivity type dopant into the channel region 30 below the gate and also avoids diffusion of the first conductivity type dopant to the lower surface 41 of the semiconductor layer 40 and, specifically, to the substrate 90, even at high concentrations. Thus, the lower energy means that the spread or straggle in the implanted ions will be reduced relative to the prior art. By using this recess-then-implant method to form the halos, it is now possible to achieve sharp, well-defined halos with a predetermined depth 43 in the semiconductor layer (e.g., a predetermined depth less than 100 A). Additionally, it is possible to achieve a predetermined high dopant concentration (e.g., up to approximately $1\times10^{21}$ atoms/cm$^3$) within the halos with minimal diffusion.

A post-implant anneal may optionally be performed (703), for example, using a laser anneal process in order to activate the implanted dopants and repair implantation damage (224). The laser anneal provides an intense amount of heat that is spatially and temporally limited over a conventional RTA activation anneal. Specifically, the RTA activation anneal has a peak temperature of 1000 C-1200 C and Tmax minus 50 C times on the order of a few seconds, whereas the laser anneal has a peak temperature between 1200 C-1400 C and Tmax minus 50 C on the order of milliseconds. Thus, the laser anneal process (224) allows for very high dopant activation with essentially zero dopant diffusion. Instead of spikeRTA which heats the entire wafer, laser anneal only heats the wafer in the illuminated area, so a ribbon or raster scan is used to cover the entire wafer. An alternate advanced anneal technique is known as flash RTA which has a similar timescale but heats the entire face of the wafer at once.) Traditionally, a rapid thermal anneal (RTA) process is used to anneal halo implants because the high energy implant already causes significant diffusion to the extent that any diffusion caused by the RTA process is negligible. However, given the low energy implant of the present method which causes minimal diffusion, a laser anneal process (which results in minimal lateral diffusion) is preferred over the traditional RTA process.

Once the halo implant is performed at process 702, the recess surfaces 75 (i.e., the surfaces 75 of the semiconductor layer 40 exposed within the recesses 70) are cleaned (704). Specifically, a chemical oxide removal (COR) process is used to clean the recess surfaces 75, as opposed to a conventional aqueous HF solution. Performing a COR pre-clean process before subsequent epitaxial growth at process 706 (discussed below) is critical to determining the epitaxial growth quality. Specifically, the traditional epitaxial deposition pre-clean technique uses an aqueous hydrofluoric acid (HF) solution as the final oxide removal step. However, such aqueous HF solutions are not sufficiently effective on doped silicon surfaces. This issue is often times overcome either by significantly increasing the HF exposure time and, hence, the oxide etch target depth. Alternatively, the pre-clean process may include a hydrogen ambient pre-bake prior to epi deposition. However, neither solution is optimal. For example, device performance can be significantly degraded as a result of extending the time period for the HF cleaning process due to unwanted etching of exposed shallow trench isolation (STI) structures and/or the dielectric spacer material, thereby subjecting the device to shorts and leaving the gate polysilicon exposed during the epitaxial growth process. Additionally, the hydrogen pre-bake process can degrade device performance by causing unwanted lateral dopant diffusion and/or deactivation.

By using a chemical oxide removal (COR) processes as the epitaxial deposition pre-clean technique 704, the undesirable aspects of the aqueous HF clean, mentioned above, can be minimized. An exemplary COR technique incorporates the use of gas phase reactants (e.g., a mixture of HF and ammonia) to perform a self-limiting etch that is adjustable by controlling the parameters, such as the ration of HF to ammonia (e.g., 2:1), the pressure (e.g., between 1 mTorr and 10 mTorr) and the temperature (e.g., approximately 25° C.) in a COR chamber. During this exposure the HF and ammonia gases react with the exposed surfaces of the semiconductor layer 40 (e.g., recess surfaces 75) to form a solid reaction product. The solid reaction product is removed in a second step either by heating the structure (e.g., to a temperature of approximately 100° C.) and, thus, causing the reaction product to evaporation, or by removing the product using a water or solution rinse. This COR pre-clean process provides several advantages over the traditional HF pre-clean process. First, the COR etch rate of thermal oxide is greater than that of deposited oxides, so oxide sidewall spacers and oxide-filled STIs can be preserved during the epitaxial pre-clean process. Thus, the COR pre-clean process allows the use of an all-oxide spacer instead of a nitride or high k dielectric spacer. Second, we have found that a hydrogen pre-bake process is not required for epitaxial growth following a COR pre-clean process. Thus, lateral diffusion of halo implant dopants can be avoided. Finally, the minimum queue time in between performing the COR pre-clean process and performing the epitaxial deposition process might be extendable so that it is longer than the minimum queue time between an HF wet clean process and the epitaxial deposition process. Specifically, this queue time may be extended by leaving the solid COR etch reaction product on the surface of the wafer. This solid precipitate would then desorb when the wafer temperature is ramped prior to the epitaxial deposition step. As noted above, a high k gate dielectric layer 951 prevents shorting of the gate because the COR process will not etch high k dielectrics.

Figure 12:
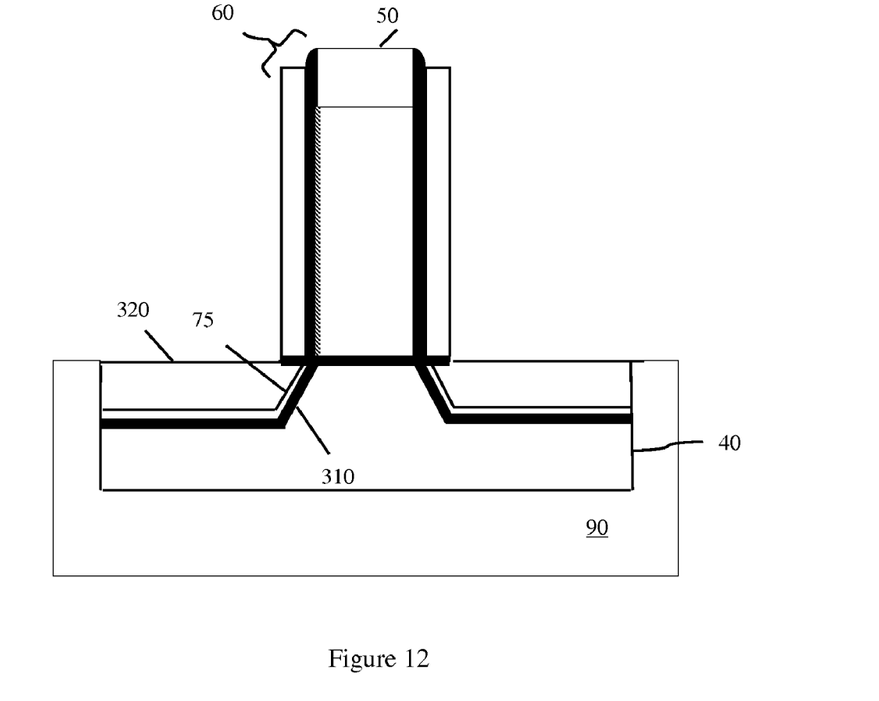
FIG. 12 is a schematic diagram illustrating a partially completed MOSFET device formed following process 707 of FIG. 7.

Following this COR cleaning (at process 704), a selective epitaxial semiconductor deposition process is performed to deposit a semiconductor material (e.g., silicon, silicon germanium, etc.) onto the exposed recess surfaces 75, thereby, filling the recesses 70 (706). During this deposition process (706), second conductivity type dopants (e.g., p-type dopants, such as boron (B)) can be incorporated into the semiconductor material so as to form in-situ doped source/drain extensions 210 on the recess surfaces 75 adjacent to the halos 210 (see FIG. 2). Alternatively, the deposition process 706 can be performed in the absence of dopants (707, see FIG. 12). Then, the source/drain extensions 320 can be formed by implanting a second conductivity type dopant (e.g., p-type dopant such as boron (B) to form an implant region 321 in the deposited semiconductor material adjacent to the halos 310 (708, see FIG. 3).

Figure 8:
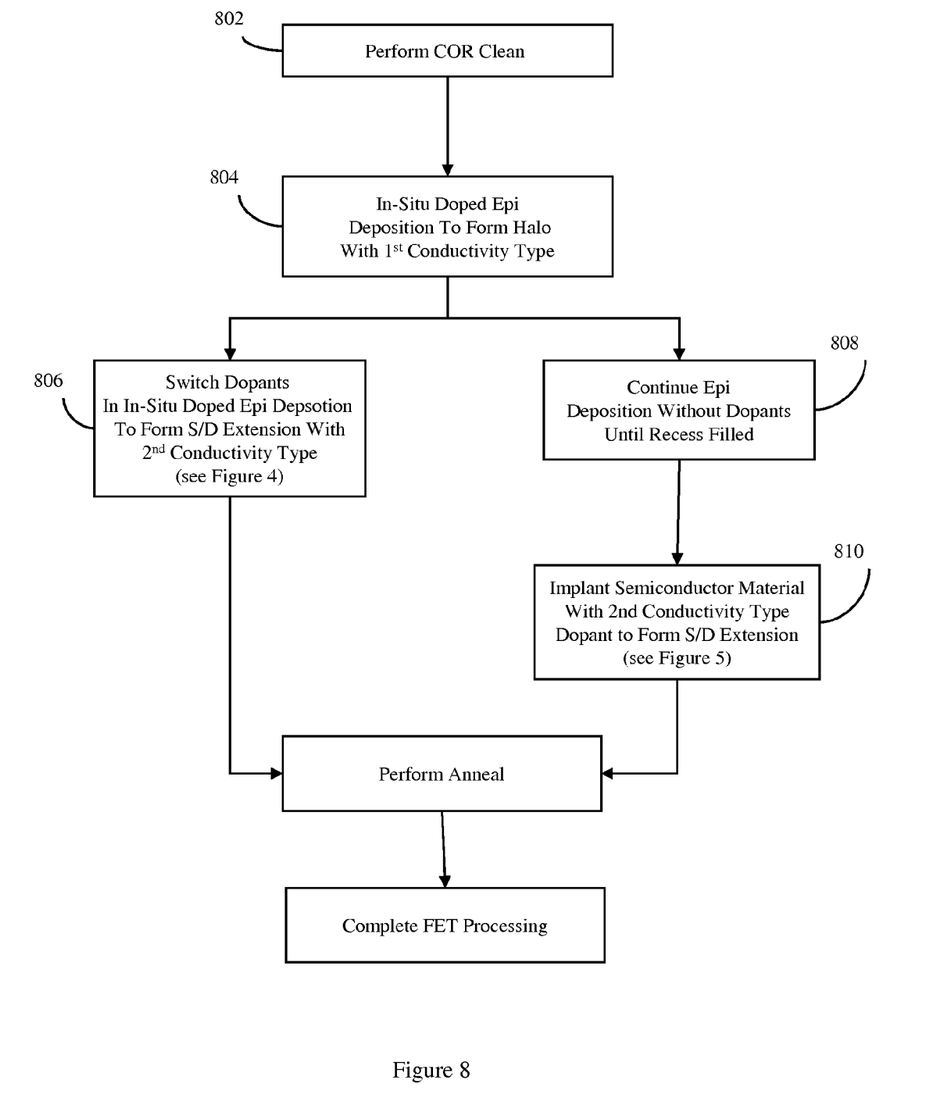

Referring to FIG. 8, in another embodiment of the method, the halos are not implanted but rather after the recesses 70 are etched (at process 614), a chemical oxide removal (COR) process (as described above at step 704) is used to clean the recess surfaces 75 (802).

Following the COR cleaning process 802, a two-stage selective epitaxial semiconductor deposition process is performed to deposit a semiconductor material (e.g., silicon, silicon germanium, etc.) onto the exposed recess surfaces 75, thereby, filling the recesses 70.

During the first stage (804) of this deposition process, a predetermined concentration of a first conductivity type dopant (e.g., n-type dopants such as, phosphorus (P), arsenic (As), and antimony (Sb)) can be incorporated into the semiconductor material so as to form in-situ doped halos (see halos 410 of FIG. 4 and 510 of FIG. 5) having a predetermined dopant concentration of up approximately $5\times10^{20}$ atoms/cm$^3$.

Once the in-situ doped halo regions 410 of FIG. 4 are formed at process 804, the dopant that is incorporated into the semiconductor material can be switched from a first conductivity type dopant to a second conductivity type dopant (e.g., a p-type dopant such as, boron (B)) so as to form in-situ doped source/drain extensions 420 adjacent to the halos 410 (806, see FIG. 4). Thus, the first doped epi would form a liner in the recessed area 70 that is the in-situ doped halo 410. The second doped epi would fill the recess 70 creating the in-situ doped source/drain extensions 420 with an opposite polarity dopant species. By using the epitaxial growth process (804 and 806) to form both the halos 410 and the source/drain extensions 420, it is now possible to achieve sharp, well-defined halos 410, with a predetermined high dopant concentration (e.g., of up to approximately $5\times10^{20}$ atoms/cm$^3$). Alternatively, once the in-situ doped halos 510 of FIG. 5 are formed, the epitaxial deposition process can continue in the absence of dopants until the recess is filled (808). Then, the source/drain extensions 520 can be formed by implanting the second conductivity type dopant into the deposited semiconductor material forming implant regions 521 above the halos 510.

The epitaxial deposition process used to form the halos avoids diffusion of the first conductivity type dopant into the channel region 30 below the gate 50 and also avoids diffusion of the first conductivity type dopant to the lower surface 41 of the semiconductor layer 40 and, specifically, to the substrate 90, even at high concentrations. By using this recess-then-epi deposition method to form the halos, it is now possible to achieve sharp, well-defined halos with a predetermined depth 43 in the semiconductor layer (e.g., a predetermined depth less than 100 A). Additionally, it is possible to achieve a predetermined high dopant concentration within the halos with minimal diffusion.

Therefore, disclosed are embodiments of a MOSFET device with well-defined halos that have a high dopant concentration and that are bound to well-defined source/drain extensions in order to minimize punch through. Also, disclosed are embodiments of a method of fabricating such a MOSFET that comprises etching a semiconductor layer to form recesses that undercut a gate dielectric layer and gate sidewall spacers. In one embodiment a low energy implant and laser anneal are performed so that the halos are defined at a predetermined depth and so that dopant diffusion is minimized. This is followed by a COR pre-clean to ensure quality epi growth and a selective epitaxial deposition process to fill the recesses. The silicon epi can be either in-situ doped or subsequently implanted to form source/drain extensions adjacent to the halos. Alternatively, the etch process can be immediately followed by the COR pre-clean process. Then, a selective epitaxial deposition process is performed to fill the recesses. During this deposition process, the deposited semiconductor material is first in-situ doped with a first conductivity type dopant to form the halos. After halo formation, the semiconductor material can be in-situ doped with a second conductivity type dopant to form source/drain extensions. Alternatively, after halo formation, the semiconductor material can be deposited in the absence of dopants and then implanted to form source/drain extensions. The COR pre-clean prior to the epitaxial deposition processes, allows the use of oxide spacers and hardmasks instead of constraining one to use nitride spacers and hardmasks.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A field effect transistor comprising:
   a first semiconductor layer having a first surface and a second surface opposite said first surface, said first semiconductor layer comprising a first conductivity type dopant;
   a substrate adjacent to said first surface;
   a gate adjacent to said second surface;

a gate sidewall spacer on said second surface positioned laterally immediately adjacent to said gate;

a recess in said first semiconductor layer, said recess undercutting said gate sidewall spacer such that a sidewall of said recess is positioned below said gate sidewall spacer and such that a bottom surface of said recess is positioned a predetermined distance from said second surface and further above said first surface;

a second semiconductor layer filling said recess;

a channel region in said first semiconductor layer at said second surface below said gate;

a source/drain extension in said second semiconductor layer within said recess such that said source/drain extension is positioned laterally relative to said channel region, said source/drain extension comprising a second conductivity type dopant having a different conductivity type than said first conductivity type dopant;

a halo comprising an implant region within said first semiconductor layer bordering said recess along said bottom surface and said sidewall such that said halo is positioned at said predetermined distance below said second surface immediately adjacent to said source/drain extension and further positioned between and immediately adjacent to both said source/drain extension and said channel region at said second surface, said implant region comprising said first conductivity type dopant at a first concentration greater than a second concentration of said first conductivity type dopant in said first semiconductor layer outside said implant region and further having edges exhibiting essentially zero outdiffusion of said first conductivity type dopant such that said halo does not extend vertically to said first surface.

2. The transistor of claim 1, said second semiconductor layer comprising an epitaxial layer that is one of in-situ doped with said second conductivity type dopant and implanted with said second conductivity type dopant.

3. The transistor of claim 1, said second semiconductor layer comprising one of silicon and silicon germanium.

4. The transistor of claim 1, said second semiconductor layer comprising a different semiconductor material than said first semiconductor layer.

5. A field effect transistor comprising:

a first semiconductor layer having a first surface and a second surface opposite said first surface, said first semiconductor layer comprising a first conductivity type dopant;

a substrate adjacent to said first surface;

a gate adjacent to said second surface;

a gate sidewall spacer on said second surface positioned laterally immediately adjacent to said gate;

a recess in said first semiconductor layer, said recess undercutting said gate sidewall spacer such that a sidewall of said recess is positioned below said gate sidewall spacer and such that a bottom surface of said recess is positioned a predetermined distance from said second surface;

a second semiconductor layer filling said recess;

a channel region in said first semiconductor layer at said second surface below said gate;

a source/drain extension in said second semiconductor layer within said recess such that said source/drain extension is positioned laterally relative to said channel region, said source/drain extension comprising a second conductivity type dopant having a different conductivity type than said first conductivity type dopant;

a halo comprising a discrete third semiconductor layer lining said bottom surface and said sidewall of said recess such that said halo is positioned at said predetermined distance below said second surface immediately adjacent to said source/drain extension and further positioned between and immediately adjacent to both said source/drain extension and said channel region at said second surface, said third semiconductor layer comprising said first conductivity type dopant at a first concentration greater than a second concentration of said first conductivity type dopant in said first semiconductor layer at said bottom surface and said sidewall of said recess.

6. The transistor of claim 5, wherein said first conductivity type dopant does not extend to said first surface.

7. The transistor of claim 5 said third semiconductor layer comprising an epitaxial layer in-situ doped with said first conductivity type dopant and said second semiconductor layer comprising an additional eptiaxial layer that is one of in-situ doped with said second conductivity type dopant and implanted with a second conductivity type dopant.

8. The transistor of claim 7, said epitaxial layer and said additional epitaxial layer each comprising one of silicon and silicon germanium.

9. The transistor of claim 7, said epitaxial layer and said additional epitaxial layer each comprising different semiconductor materials.

10. The transistor of claim 5, second semiconductor layer comprising a different semiconductor material than said first semiconductor layer.

11. The transistor of claim 1, a dopant concentration of said first conductivity type dopant in said implant region being approximately $1 \times 10^{21}$ atoms/cm$^3$.

12. The transistor of claim 5, a dopant concentration of said first conductivity type dopant in said third semiconductor layer being approximately $5 \times 10^{20}$ atoms/cm$^3$.

13. A field effect transistor comprising:

a first semiconductor layer having a first surface and a second surface opposite said first surface, said first semiconductor layer comprising a first conductivity type dopant;

a substrate adjacent to said first surface;

a gate adjacent to said second surface;

a gate sidewall spacer on said second surface positioned laterally immediately adjacent to said gate;

a recess in said first semiconductor layer, said recess undercutting said gate sidewall spacer such that a sidewall of said recess is positioned below said gate sidewall spacer and such that a bottom surface of said recess is positioned a predetermined distance from said second surface;

a second semiconductor layer filling said recess;

a channel region in said first semiconductor layer at said second surface below said gate;

a source/drain extension in said second semiconductor layer within said recess such that said source/drain extension is positioned laterally relative to said channel region, said source/drain extension comprising a second conductivity type dopant having a different conductivity type than said first conductivity type dopant;

a halo positioned along said bottom surface of said recess at said predetermined distance below said second surface and along said sidewall of said recess from said bottom surface to said second surface of said first semiconductor layer, positioned between said source/drain extension and said channel region and positioned between said source/drain extension and said first surface, said halo comprising any one of the following:

an implant region within said first semiconductor layer bordering said recess along said bottom surface and said sidewall, said implant region comprising said first conductivity type dopant at a greater concentration than in other regions of said first semiconductor layer and further having edges exhibiting essentially zero outdiffusion of said first conductivity type dopant such that said halo does not extend vertically to said first surface; and a third semiconductor layer lining said recess, said third semiconductor layer comprising said first conductivity type dopant at a greater concentration than said first semiconductor layer.

14. The transistor of claim 13, said second semiconductor layer comprising one of silicon and silicon germanium.

15. The transistor of claim 13, said second semiconductor layer comprising a different semiconductor material than said first semiconductor layer.

16. The transistor of claim 13, wherein a dopant concentration of said first conductivity type dopant in said implant region is approximately $1 \times 10^{21}$ atoms/cm$^3$.

17. The transistor of claim 13, wherein a dopant concentration of said first conductivity type dopant in said third semiconductor layer is approximately $5 \times 10^{20}$ atoms/cm$^3$.

* * * * *